(12) United States Patent
Epperson et al.

(10) Patent No.: US 9,377,485 B2
(45) Date of Patent: Jun. 28, 2016

(54) HANDHELD MEASUREMENT SYSTEM WITH SELECTABLE OPTIONS

(71) Applicant: Fluke Corporation, Everett, WA (US)

(72) Inventors: David Lawrence Epperson, Everett, WA (US); Glen Howard Vetter, Stanwood, WA (US); Joseph V. Ferrante, Redmond, WA (US)

(73) Assignee: Fluke Corporation, Everett, WA (US)

( * ) Notice: Subject to any disclaimer, the term of this patent is extended or adjusted under 35 U.S.C. 154(b) by 419 days.

(21) Appl. No.: 13/844,407

(22) Filed: Mar. 15, 2013

(65) Prior Publication Data

US 2014/0282241 A1 Sep. 18, 2014

(51) Int. Cl.
*G01R 1/02* (2006.01)
*G06F 3/0488* (2013.01)
*G01R 13/02* (2006.01)

(52) U.S. Cl.
CPC .............. *G01R 1/025* (2013.01); *G06F 3/0488* (2013.01); *G01R 13/02* (2013.01)

(58) Field of Classification Search
CPC ...... G01R 1/025; G01R 13/02; G06F 3/0488; G06F 3/0481–3/0484
See application file for complete search history.

(56) References Cited

U.S. PATENT DOCUMENTS

| | | | | |
|---|---|---|---|---|
| 4,821,030 A * | 4/1989 | Batson et al. | | 345/173 |
| 6,064,372 A * | 5/2000 | Kahkoska | | 345/173 |
| 6,088,029 A * | 7/2000 | Guiberson et al. | | 715/808 |
| 6,927,564 B2 * | 8/2005 | Arnoux et al. | | 324/141 |
| 6,985,819 B2 * | 1/2006 | Lipscomb et al. | | 702/57 |
| 7,626,375 B2 * | 12/2009 | Garland et al. | | 324/115 |
| 8,195,413 B2 * | 6/2012 | Freidhof | | 702/68 |
| 8,269,481 B2 * | 9/2012 | Garland et al. | | 324/115 |
| 8,456,152 B2 * | 6/2013 | Garland et al. | | 324/115 |
| 8,624,580 B2 * | 1/2014 | Reich et al. | | 324/121 R |
| 8,732,604 B2 * | 5/2014 | Okamoto et al. | | 715/772 |
| 2001/0000964 A1 * | 5/2001 | Alexander | | 345/440 |
| 2003/0169257 A1 * | 9/2003 | Alexander et al. | | 345/440 |
| 2003/0200044 A1 * | 10/2003 | McTigue et al. | | 702/117 |
| 2004/0113773 A1 * | 6/2004 | Nieters et al. | | 340/539.22 |
| 2005/0135259 A1 * | 6/2005 | Yazdi et al. | | 370/241 |
| 2006/0289768 A1 * | 12/2006 | Vallese et al. | | 250/353 |
| 2007/0271067 A1 * | 11/2007 | Cohn et al. | | 702/183 |
| 2008/0103375 A1 * | 5/2008 | Kiani | | 600/323 |
| 2009/0054743 A1 * | 2/2009 | Stewart | | 600/301 |
| 2009/0128124 A1 * | 5/2009 | Garland et al. | | 324/115 |
| 2009/0128126 A1 * | 5/2009 | Garland et al. | | 324/115 |
| 2009/0140721 A1 * | 6/2009 | Garland et al. | | 324/115 |
| 2010/0016700 A1 * | 1/2010 | Sieh et al. | | 600/365 |
| 2010/0131653 A1 * | 5/2010 | Dharwada et al. | | 709/227 |
| 2010/0231197 A1 * | 9/2010 | Jamieson et al. | | 324/115 |
| 2011/0144586 A1 * | 6/2011 | Michaud et al. | | 604/151 |
| 2012/0095309 A1 * | 4/2012 | Price et al. | | 600/365 |
| 2013/0127904 A1 | 5/2013 | Dove et al. | | |

* cited by examiner

*Primary Examiner* — Steven B Theriault
(74) *Attorney, Agent, or Firm* — Seed IP Law Group PLLC (57) ABSTRACT

In at least one embodiment, a handheld measurement system for receiving measurement data. The handheld measurement system generates a measurement image derived from the received measurement data. The handheld measurement system also generates a plurality of option images that each correspond to a particular option. A touch screen is coupled to the measurement device, and the touch screen displays the measurement image and the option images. The displayed option images are selectable, and the measurement device is configured to modify the measurement image in response to a selection.

22 Claims, 10 Drawing Sheets

HANDHELD MEASUREMENT SYSTEM WITH SELECTABLE OPTIONS

BACKGROUND

Handheld measurement tools such as digital multimeter (DMM) devices are used to measure a variety of parameters in a wide array of industrial and household settings. Sometimes a technician using a handheld measurement tool needs to measure a property of a system over an extended period of time, for example, to determine the presence of an intermittent fault. To perform such measurements, a technician has traditionally been required to record the readings manually. Further analysis of the measured data has traditionally required that a technician manually enter the measured data into a computer.

Some types of troubleshooting requires multiple instrument readings at different locations, and sometimes these measurements need to occur simultaneously or in close time proximity. Furthermore, calculations may need to be manually performed on measured data received from different locations.

Recently, more extensive multi-device measurement functionality and data storage have been incorporated into handheld measurement tools. Some measurement tools are now capable of displaying readings from remote measurement modules and storing measured data. However, adding multi-device functionality and storage capabilities brings concerns that the handheld measurement tools will be overly complex and difficult to use.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In at least one embodiment of the present disclosure, a handheld measurement system is provided. The measurement system generally includes a measurement device, a processor and a touch screen system. The processor receives primary measurement data for the measurement device. The processor is further configured to generate a measurement image derived from the primary measurement data, and wherein the processor is also configured to generate a plurality of option images, wherein each option image corresponds to a particular option, and a touch screen system communicatively coupled to the processor, wherein the touch screen system is configured to display the measurement image and the option images, wherein the displayed option images are selectable. The processor is configured to modify the measurement image in response to a selection of a displayed option image.

In at least one embodiment of the present disclosure, a handheld digital multimeter is provided. The handheld digital multimeter is configured to measure at least one electrical parameter and generate a measurement image derived from the at least one measured electrical parameter. The handheld digital multimeter is also configured to generate a plurality of option images, wherein each option image corresponds to a particular option display the measurement image and the option images on a touch screen, wherein the measurement image and the option images are displayed simultaneously. The displayed option images are selectable by an input into the touch screen. The measurement device is configured to modify the measurement image in response to a selection of at least one of the displayed option images.

Furthermore, in at least one embodiment, a measurement image on a handheld device comprising measuring at least one parameter with a handheld measurement device, generating a measurement image, wherein the generated measurement image is derived from the measured parameter. The method further includes generating a plurality of option images; displaying the generated measurement image and the generated option images on a touch screen. The measurement image and the option images are displayed simultaneously. Each displayed option image corresponds to a selectable option. The method further includes modifying the measurement image displayed on the touch screen in response to a selection of a particular option image displayed on the touch screen.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

In various embodiments, disclosed herein are system and methods for displaying a image derived from measured parameters. The disclosed systems and methods allow an image to be displayed and modified while multiple selectable options are simultaneously present. Parameters may be included or excluded into or out of an image in response to user touch inputs. Potential operations based on the measurement inputs are determined and displayed. Examples of the systems and methods of the present disclosure will provide advantages to users of handheld measurement tools, especially for users that stored data or taking multiple simultaneous measurements.

Figure 1:
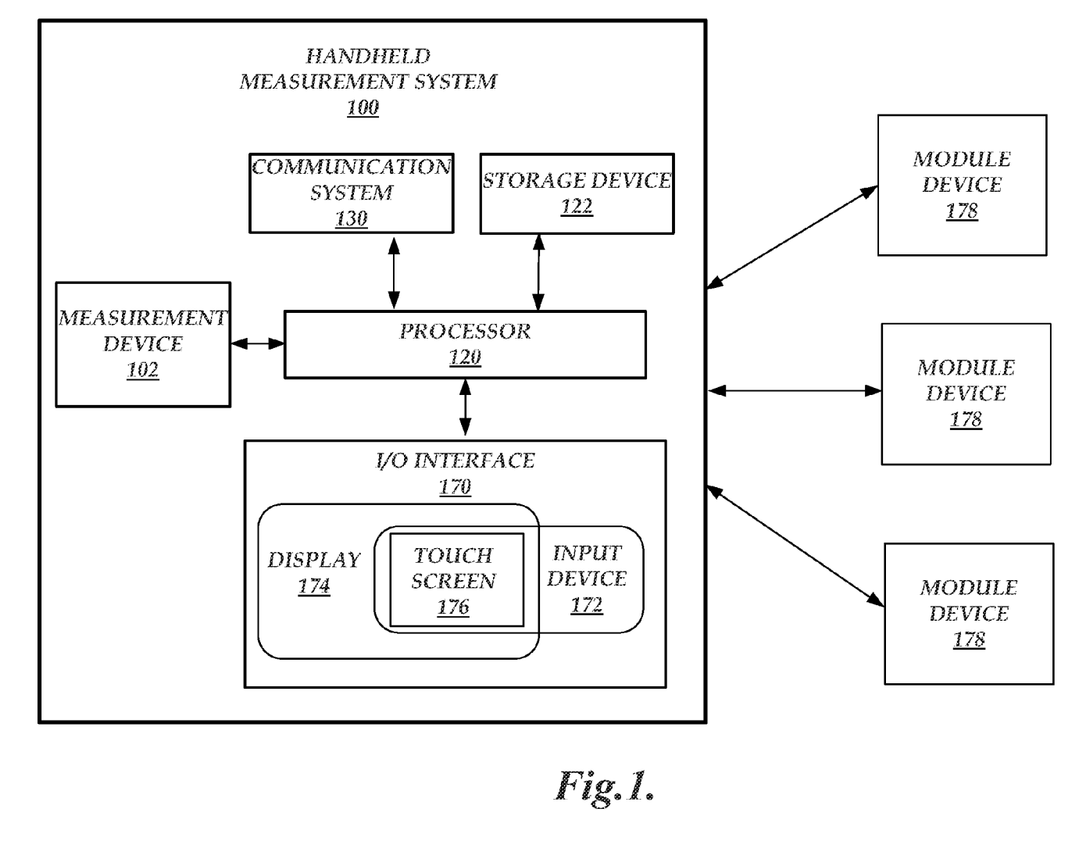
FIG. 1 illustrates a block diagram of an exemplary handheld measurement system.

FIG. 1 illustrates a block diagram of a handheld measurement system 100. The handheld measurement system 100 is only one example of a suitable handheld measurement system and is not intended to suggest any limitation as to the scope of use or functionality of the disclosed embodiments. In various embodiments, the handheld measurement system may be, for example, a DMM, a WiFi network tester, a vibration tester, etc. However, the handheld measurement system 100 could include any type of mobile testing/measurement device or could be a multipurpose device capable of performing a combination of types of measurement devices.

As will be better understood from the following description, as used herein, the term measured parameter refers to data that directly or indirectly relates to a measured property. Handheld measurement system 100 may measure all types of parameters, such as electrical and mechanical parameters. As an example, properties may that may be measurable by the handheld measurement system include, for example, vibration, humidity, pressure, temperature, decibels, and many others.

A handheld measurement system 100 or device as described herein includes one or more devices generally configured to be holdable in a user's hand while taking a measurement. However, it should be appreciated that the system or device need not always be held in a user's hand and may be positioned by a user to not be held, for example, by affixing or hanging the system or device from a support or from a machine.

Still referring to FIG. 1, the handheld measurement system 100 includes a processor 120, a storage device 122, a communication system 130, and an I/O interface 170. As used herein, the term processor is not limited to integrated circuits referred to in the art as a computer, but broadly refers to a microcontroller, a microcomputer, a microprocessor, a programmable logic controller, an application specific integrated circuit, other programmable circuits, combinations of the above, among others. The processor 120 serves as the computational center of the handheld device 102 by supporting the execution of instructions and reading and writing data to the storage device 122, I/O interface 170, and communication system 130. The storage device 122 includes one or more forms of computer-readable storage media. Computer-readable storage media is any currently available or later developed media suitable for storing programs and data accessible by one or more device components, such as the processor 120. Computer readable storage media may be removable or non-removable and may be volatile or non-volatile. Examples of computer-readable storage media may include hard drives as well as RAM, ROM, EEPROM, flash types of memory, etc.

Communication system 130 includes one or more components for communicating with an external devices, such as the wireless device. All such communication may be wired or wireless. In some embodiments, the handheld measurement system 100 is communicatively coupled to one or more module devices 178, preferably over a wireless path. In some embodiments, module devices 178 are independent devices, that is, module devices that communicate independently. In some embodiments, the handheld measurement system 100 is coupled to a plurality of test tools such as CNX 3000 test tools made by Fluke Corporation. The module device 178 may communicate measurement parameters or measurement data to the handheld measurement system 100 over a wireless path. In some embodiments, the module devices 178 include processors or other logic circuitry and may process measured data into different forms and pass the processed measurement data to the handheld measurement system 100. In some embodiments, the received measured parameters are stored by the handheld measurement system 100 in storage device 122. The stored measurement parameters may later be retrieved and used in exemplary processes 400 and 500, for example. In some embodiments, the handheld measurement system 100 may control or command module devices 178.

The I/O interface 170 includes an input device 172, a display 174, and a touch screen 176. The I/O interface 170 may include any devices that allows a user to control or an external system to interact with the processor 120 and any devices that would allow the processor 120 to display information, such as images. In at least one embodiment, the I/O interface 170 allows a user to control or configure the measurement device 102 to perform a particular measurement or request particular data from the measurement device 102. Information regarding the particular configuration of mobile measurement system 102 may be stored in the storage device 122.

The display 174 may be, for example, a liquid crystalline display (LCD) device, a light emitting diode (LED) device, an organic light emitting diode (OLED) device. The display 174 may be capable of displaying color images, though embodiments disclosed herein can also be made to work with black and white displays. The display 174 includes the touch screen 176, which, in some embodiments, incorporates the input device 172 into the display 174. The touch screen 176 may be any type of touch screen currently known or later developed. For example, the touch screen 176 may be a capacitive, infrared, resistive, or surface acoustic wave (SAW). In response to an input by the input device 172, the handheld measurement system 100 may display information or data related to a specific measurement. For many measurement tool applications, the touch screen 176 in some embodiments is suitable for use in industrial settings. In some embodiments, the touch screen 176 is able to receive inputs through gloved hands.

In addition to the touch screen 176, the input device 172 may include a single input device or a combination of input devices configured to communicate an input to the handheld measurement system 100. Input device 172 may include, as examples, buttons, switches, trigger switches, selectors, a rotary switch or other input devices known to those of ordinary skill in the art. In at least one embodiment, the measurement device 102 is configured to perform a particular type of measurement in response to a user input or selection that is input to the input device 172.

Figure 2:
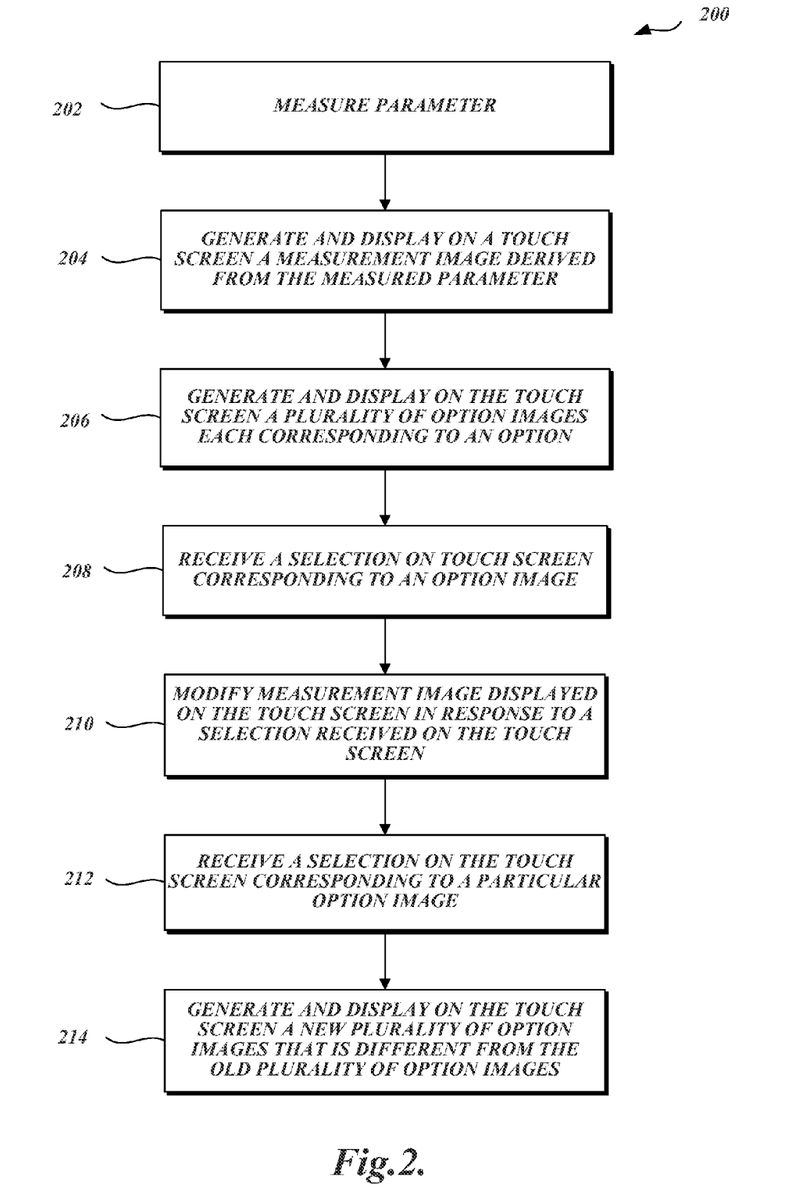
FIG. 2 illustrates one example of a process that may be performed by the handheld measurement system illustrated in FIG. 1.

FIG. 2 illustrates one example of a process that may be performed by the handheld measurement system 100. At block 202, the handheld measurement system 100 measures a parameter using measurement device 102. Handheld measurement system 100 may measure, for example, electrical and/or mechanical parameters. At block 204, the handheld measurement system 100 generates and displays on the touch screen 176 a measurement image derived from the measured parameter. The measurement image may include a textual representation of the measured parameter or a graphical representation of the measured parameter. In some embodiments, a received measured parameter is used by the measurement system 100 to determine another property. For example, if the measured parameter for a system is current, and the handheld measurement system receives a measured parameter corresponding to voltage, the measurement image may include a textual representation of the power.

Figure 7A:
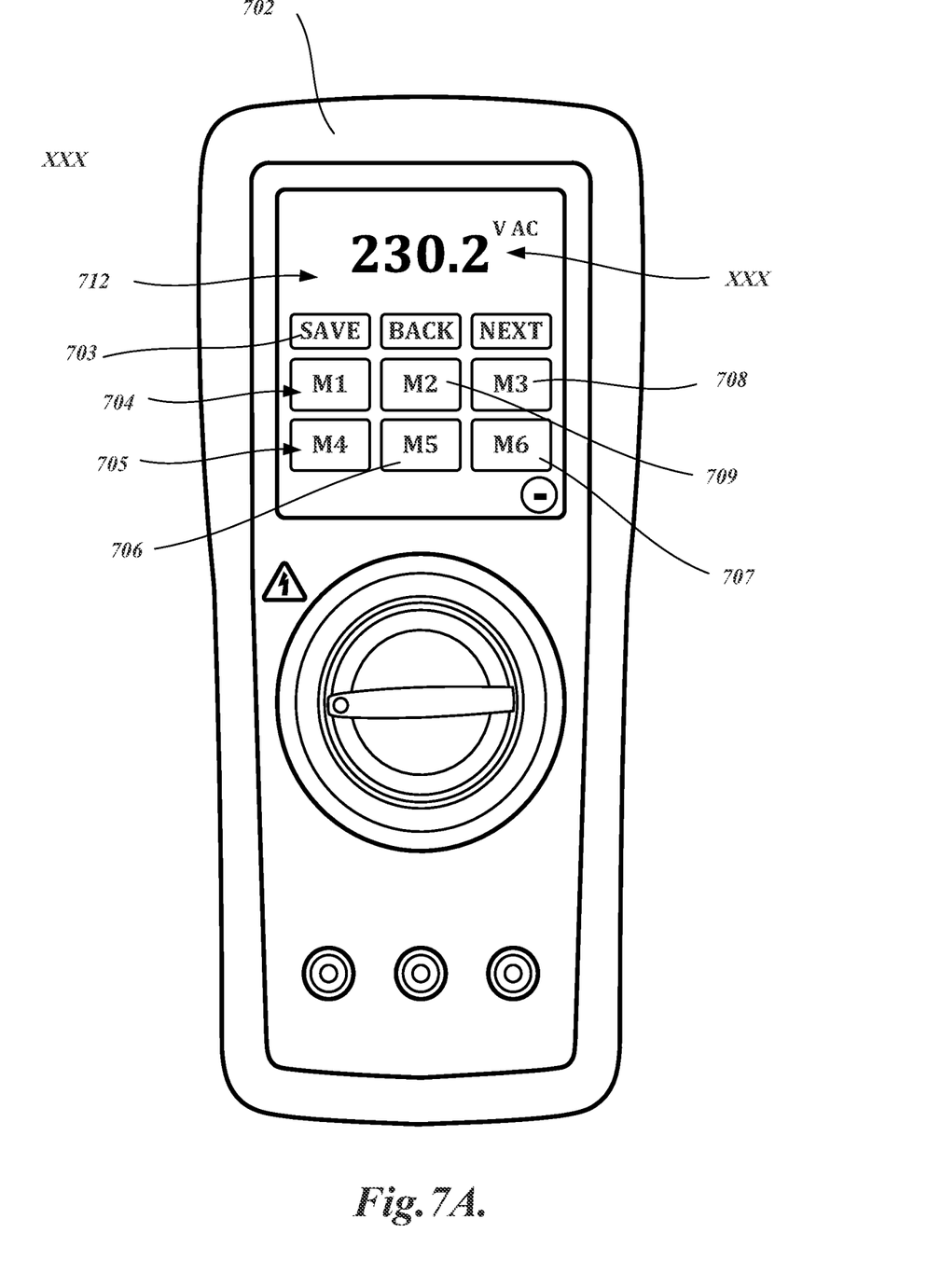
FIG. 7A illustrates another example of a handheld measurement system.
Figure 7B:
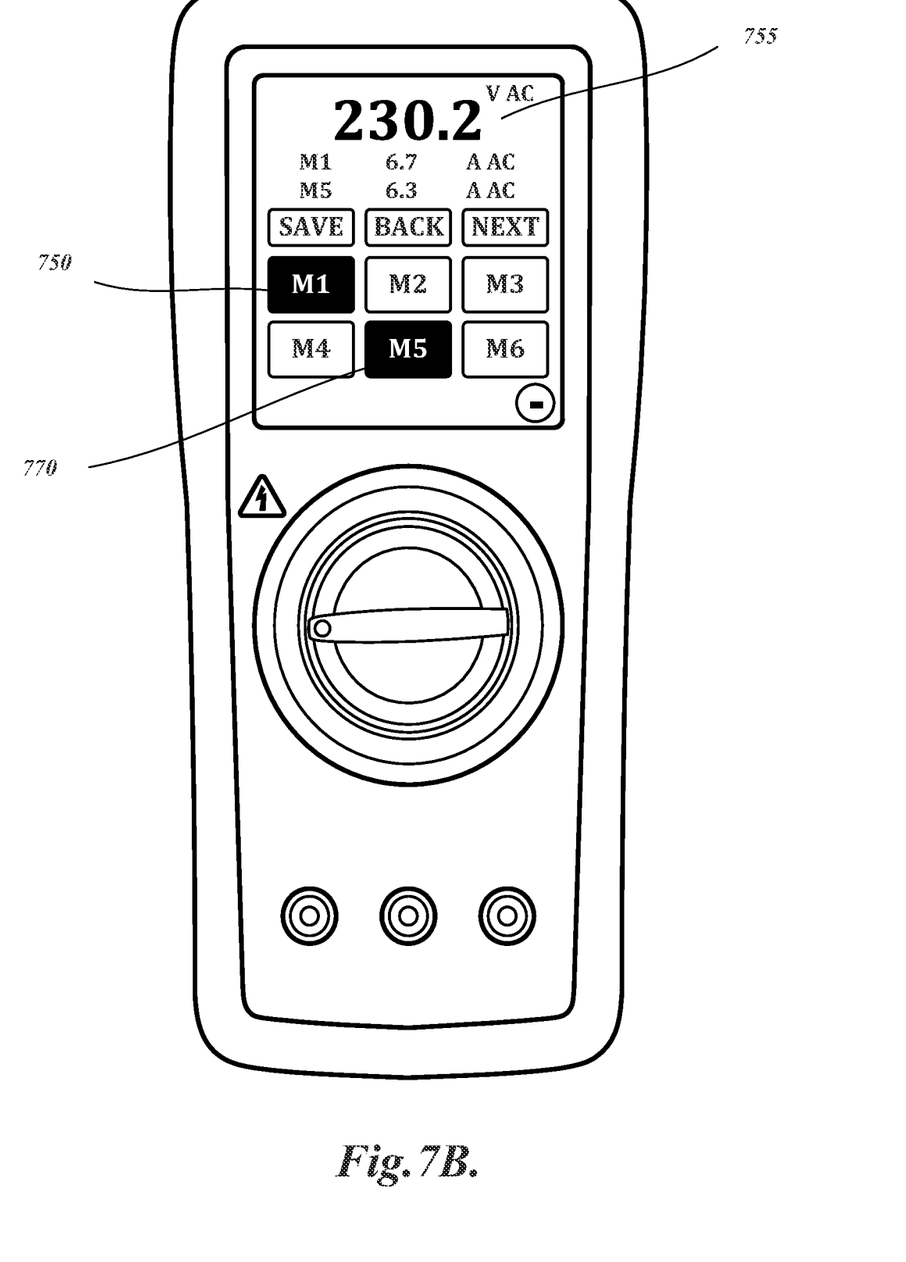
FIG. 7B illustrates an exemplary embodiment of another handheld measurement system.

At block 206, the handheld measurement system 100 generates and displays on the touch screen 176 a plurality of option images. Each option image corresponds to a particular option. Option images are shown in FIGS. 7A and 7B, for example. Option images may be associated with stored data, data received from other devices or modules, or operations that may performed. As will be discussed in more detail below, in response to receiving a selection corresponding to a particular option image on the touch screen 176, the handheld measurement system 100 may modify the plurality of option images or measurement image.

Figure 4:
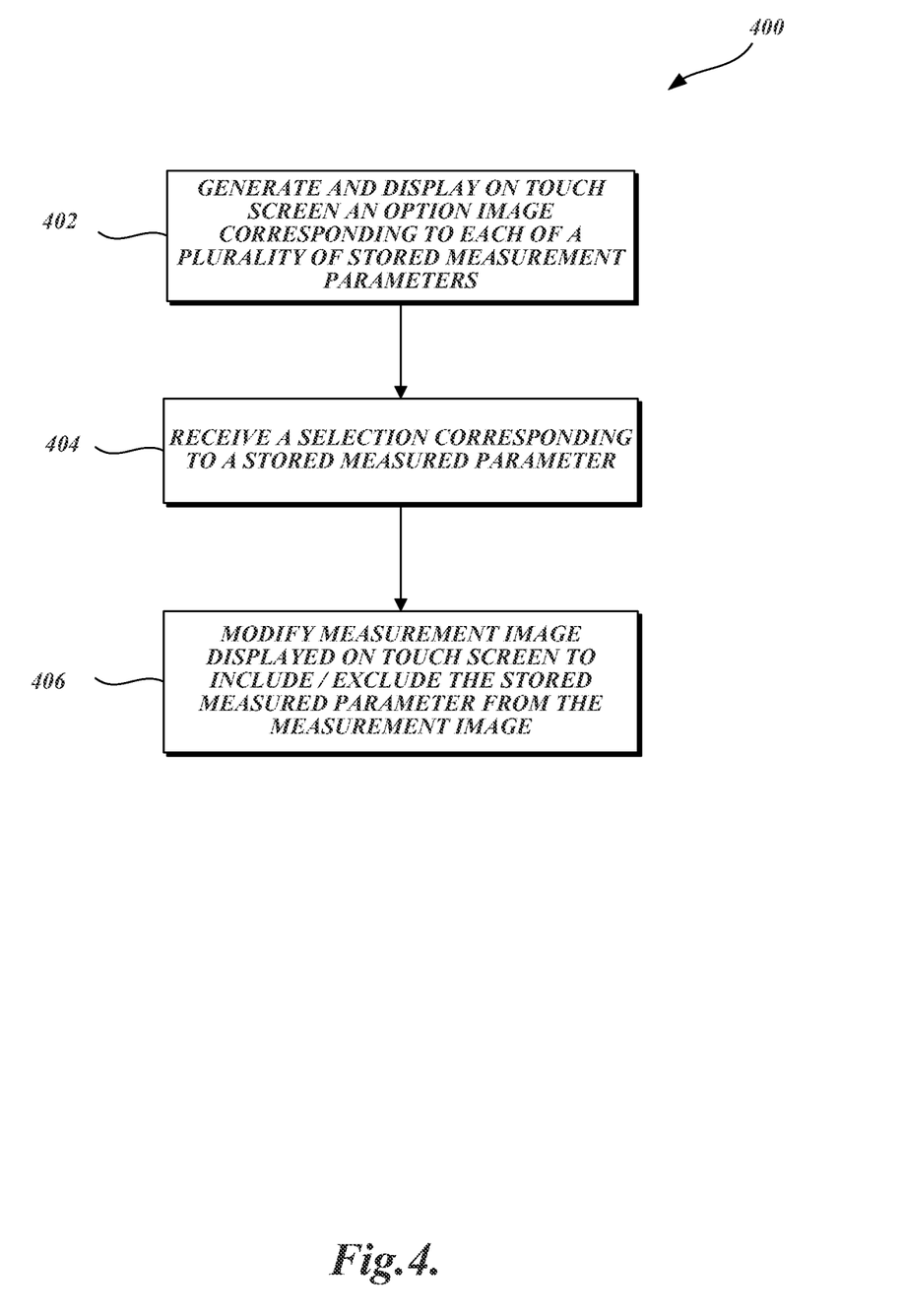
FIG. 4 illustrates yet another example of a process that may be performed by the handheld measurement system illustrated in FIG. 1.
Figure 5:
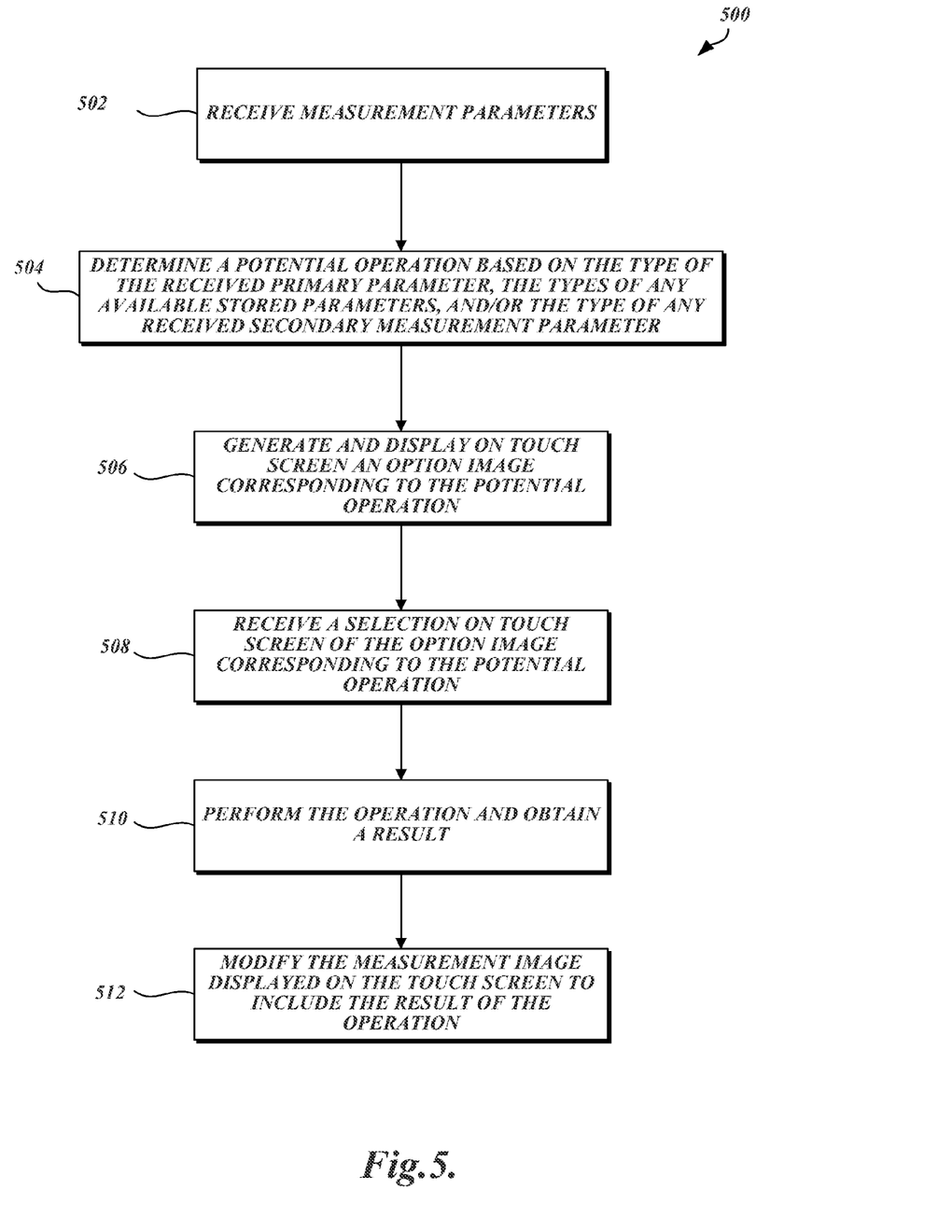
FIG. 5 illustrates still yet another example of a process that may be performed by the handheld measurement system illustrated in FIG. 1.

At block 208, the handheld measurement system receives an input to the touch screen 176 corresponding to a particular option image. In response to receiving an input at an option image on touch screen 176, at block 210, the handheld measurement system 100 modifies the measurement image displayed on the touch screen 176. As shown in FIGS. 4 and 5, the handheld measurement system 100 may add or remove measurement data or add or remove stored data from the measured image. In some embodiments, the handheld measurement system 100 may also generate additional option images.

At block 212, the handheld measurement system 100 receives a selection on the touch screen 176 corresponding to a particular option image. For example, the selection on the touch screen 176 may correspond to a request for stored measured parameters. At block 214, the handheld measurement system 100 generates and displays on the touch screen 176 a new plurality of option images that is different from the old previously displayed images.

Figure 3:
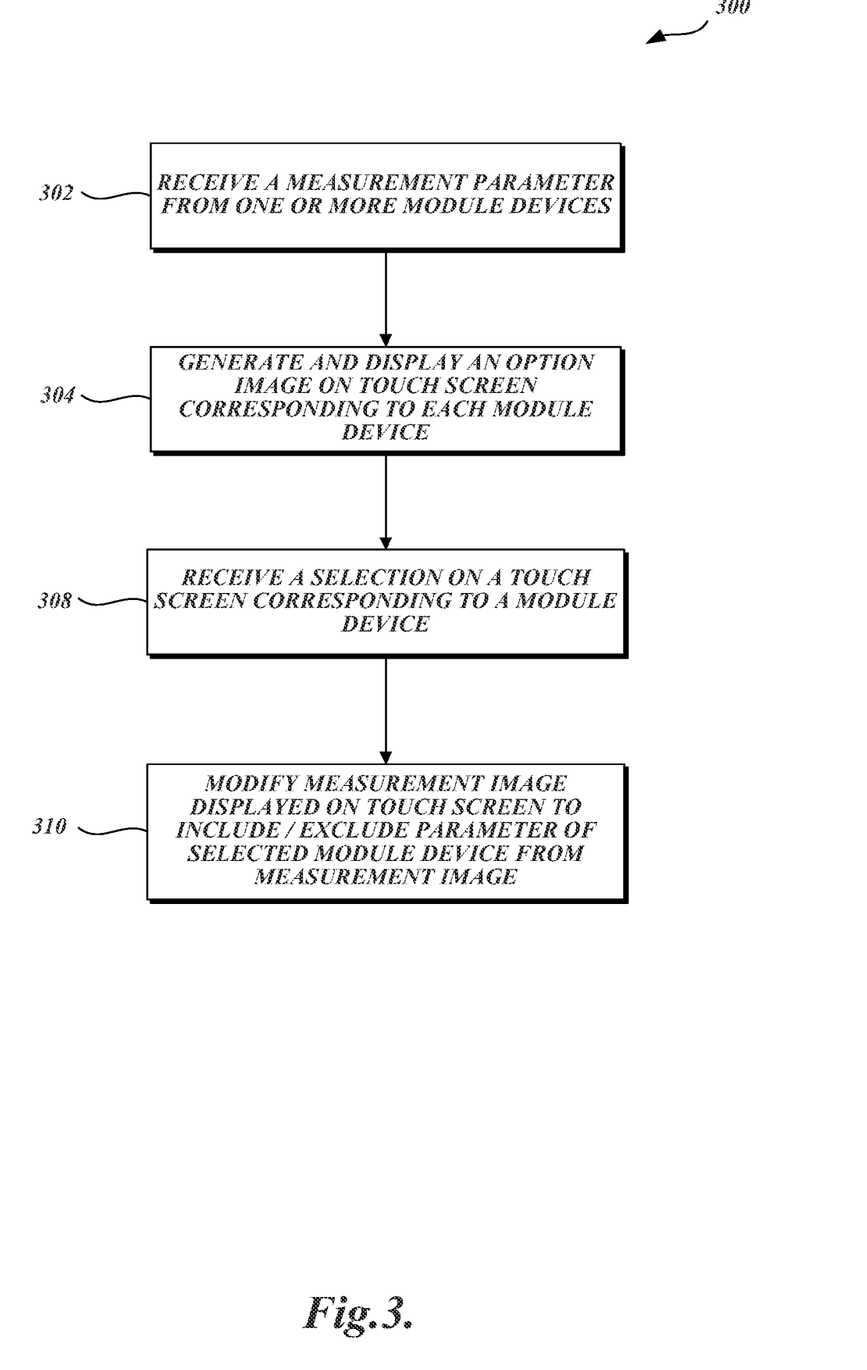
FIG. 3 illustrates another example of a process that may be performed by the handheld measurement system illustrated in FIG. 1.

FIG. 3 illustrates another example of a process that may be performed by the handheld measurement system 100. At block 302, the handheld measurement system 100 receives a measurement parameter from one or more of the module devices 178. At block 304, the handheld measurement system 100 generates and displays an option image on the touch screen 176 corresponding to a module device 178. At block 308, a selection is received on an option image corresponding to a particular module device 178. At block 310, the handheld measurement system 100 adds or removes the measured parameter of the selected module device from the measurement image.

FIG. 4 illustrates another example of a process 400 that may be used with the handheld measurement system 100. Process 400 is shown in At block 402, the handheld measurement system 100 generates and displays on touch screen 176 an option image corresponding to each of a plurality of measurement parameters stored in storage device 122. At block 404, the handheld measurement system 100 receives a selection corresponding to a stored measured parameter. At block 406, the handheld measurement system 101 modifies the measurement image displayed on the touch screen 176 to include or exclude a stored measured parameter.

Figure 8A:
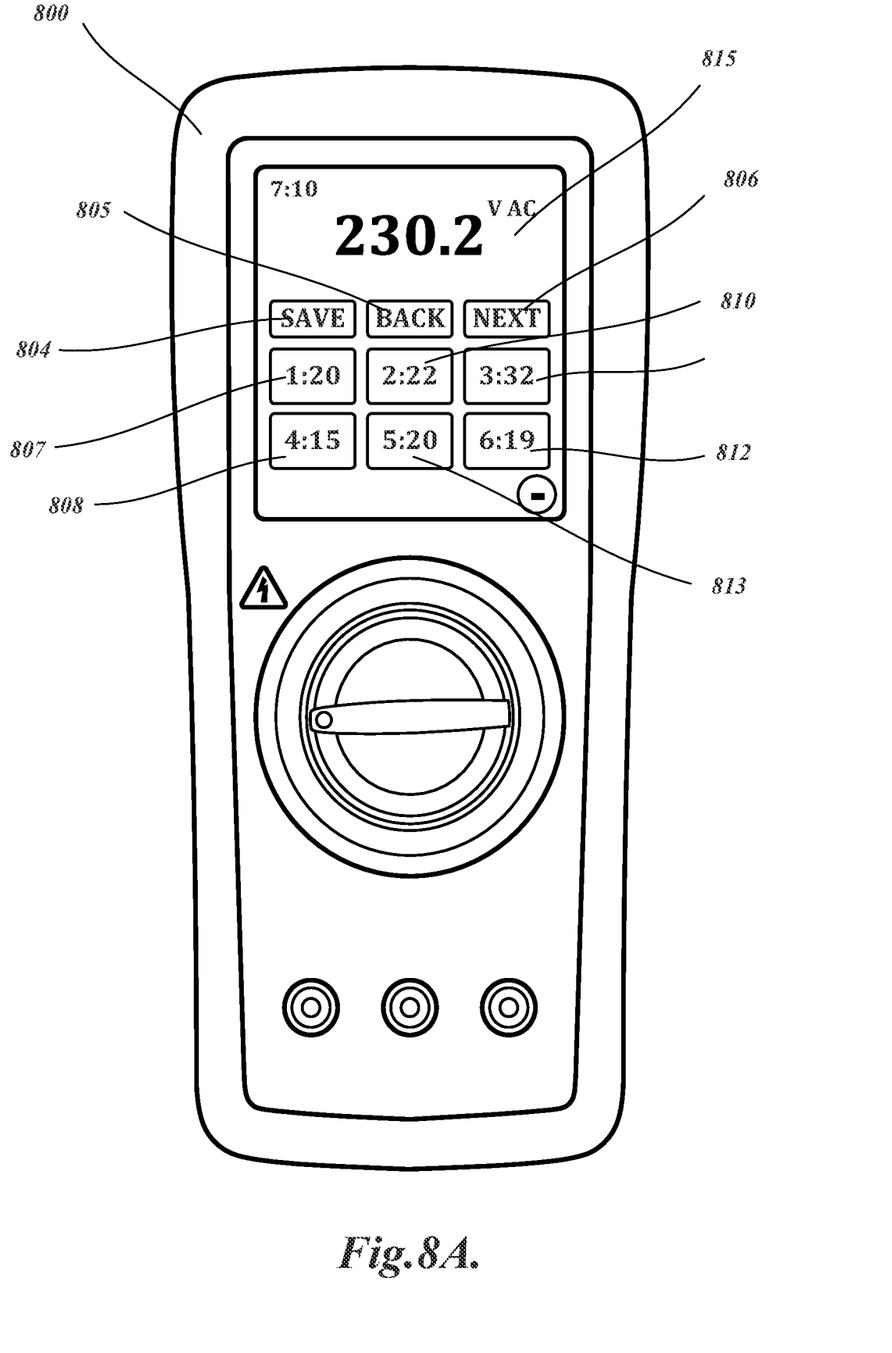
FIG. 8A illustrates another example of a handheld measurement system.

Turning now to FIG. 8A, a handheld DMM system 800 is depicted. Touch screen 801 displays measured image 815, which is a textual representation of a measurement parameter measured by the DMM system 800. A plurality of option images are displayed on the touch screen 801. Selection or touching an option image 804 ("SAVE") causes the measured parameter shown in measured image 815 to be saved. Selection or touching an option image 805 ("BACK") recreates the previously displayed image options and corresponding choices. Selection or touching an option image 806 ("NEXT") generates new option images and corresponding choices. An image option 807 ("1:20") refers stored data for a particular time. An image option 808 (4:15) also refers to stored data for a particular time as do image options 810 ("2:22"), 813, 812, and 811.

Figure 8B:
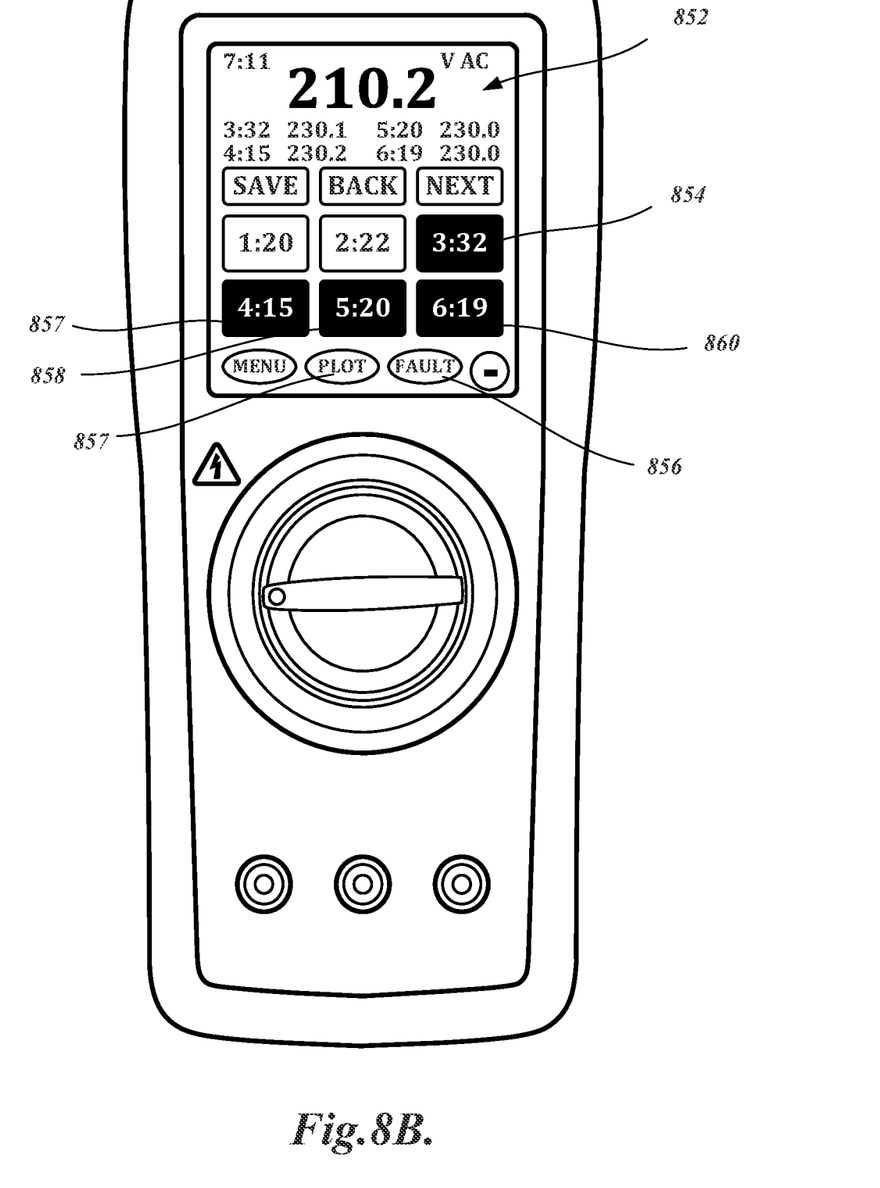
FIG. 8B illustrates another example of a handheld measurement system.

Referring now to FIG. 8B, a measured image 852 includes a measured parameter 852 ("210.2"), which is numerically lower than the measured parameter shown in measured image 815 ("230.2") of FIG. 8A. Option images 858, 857, 854, and 860 of FIG. 8B are a darker color to indicate selection. In FIG. 8B, the measurement image 852 includes stored measurement parameters. The transition from 8A to 8B shows the selection of option images and the corresponding modification of the measurement image as described in process 400. Also, part of the to be described process 500 is shown in FIGS. 8A and 8B.

FIG. 5 illustrates one example of a process 500 for determining a potential operation and including a result in the measurement image. Process 500 may be automatically initiated in response to receiving particular measured parameters or it may be initiated in response to an input to the touch screen or other input device 172. At block 502, the handheld measurement system 100 receives measured parameters. The received measured parameters may include one or more parameters measured by the measurement device 102. The received measurement parameters may also include measured parameters from the module devices 178. As previously mentioned, parameters received by the measurement system 100 may include, for example, electrical and/or mechanical parameters. In some embodiments, only those parameters that are included in the measured image at the time of the determination are considered in the determination of a potential operation.

At block 504, the system 100 determines a potential operation based on the received measured parameters and/or the stored measured parameters. In an exemplary embodiment, the system 100 determines the measurement parameters received from three module devices 178; which, for example, are AC currents below 35 amps, and the measured parameter received by the measurement device 102 is 0.0 V AC. Based on this information, in one embodiment the system 100 determines that a potential operation is, for example, a current imbalance test. The system 100 may determine a potential operation for a set of parameters using a look-up table, user setting, computer program, algorithms, or other methods known in the art. The system 100 may determine a potential operation by factors other than parameters. For example, a potential operation may be determined because it is a default operation, or is based on a user history for the handheld measurement system 100. In some embodiments, more than one potential operation may be determined. Examples of potential operations may include max/min determination, plotting, calculated power, standard deviation, fault detection, power interruption test, continuity phase measurement, etc. Any possible operation using stored parameters or received measured parameters may be potential operation.

After determining a potential operation, at block 504, the handheld measurement system 100 generates and displays on the touch screen 176 an option image corresponding to the potential operation at block 506. If more than one potential operation is determined, more than one option image may be generated and displayed. At blocks 508 and 510, in response to a selection input to the touch screen 176, the handheld measurement system 100 performs the operation and obtains a result. In an embodiment where a current imbalance operation is performed, one result is the indication of a particular module device 178 that is measuring a current that is higher or lower than the current of the other module devices 178. Another potential result in a current imbalance operation is that no imbalance exists. At block 512, the measurement image is modified to include the result of the operation. The result may be included into the measurement image and may indicate the result as text, color change, format change, graphs, icons, alert images, shading, etc.

Referring back to FIGS. 8A and 8B, a significant voltage drop is indicated as having occurred from 8A to 8B. In response to the voltage drop, a potential operation was determined and displayed as option image 856 ("Fault"). Selecting Option image 856 will initiate a fault finding application to determine the fault. Furthermore, the selection of stored measurement data resulted in the determination and display of option image 857 ("PLOT"). Selecting the option image 857 would modify the measured image to display a plot. Importantly, all of the processes in some embodiments are occurring while the measurement parameter measured by measurement device 102 is displayed on the touch screen.

Figure 6:
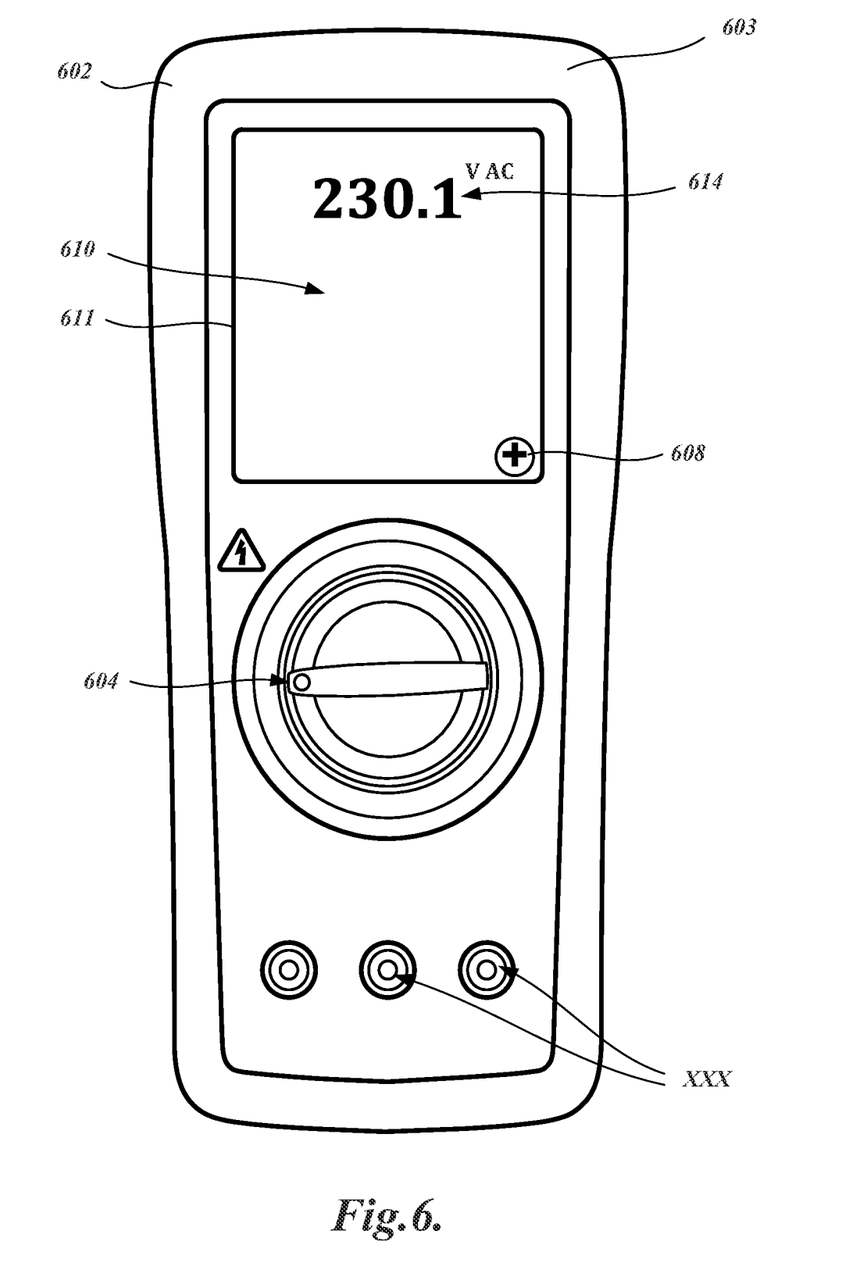
FIG. 6 illustrates one example of a handheld measurement system.

FIG. 6 is a front view of a DMM system 602 showing an absence of displayed option images in accordance with embodiments of the present disclosure. The DMM system 602 includes a rotary switch 604, terminals 606, a display 611, a touch screen 612, and a housing 603. The housing surrounds a part of the device at an outer layer. Terminals 606 allow for measurement instruments, such as leads or probes (not shown), to be connected to the DMM system 602 and allow for the DMM system 602 to receive measured parameters. Housing 603 provides an insulation barrier around device circuitry as well as reducing the chance of undesired contact between the user with the touch screen 612. Rotary switch 604 may be used to configure the device to take particular measurements. Rotary switch 604 is presently configured to be set at "V AC" (Volts AC), which is displayed by the touch screen 612 as part of the in measured image 614. Measured image 614 includes text "230.1 V AC", which is the AC voltage as measured between the terminals 606. The touch screen includes a lower portion 610 that presently does not include any option image. A maximize image 608 ("+") is displayed on the touch screen 612. If an input is received on touch screen 612 via the maximize icon 608, option images will be generated.

FIG. 7A is front view of a DMM system 702 showing option images corresponding to a plurality of module devices in accordance with embodiments of the present disclosure. DMM includes a touchscreen 712 displaying a measurement image 714 that includes text "230.2 V AC," which is the AC voltage measured by the DMM system 702. DMM system 702 includes a plurality of option images. A "Save" option image 703 is displayed on the touch screen 712. In some embodiments, selection of the "SAVE" option image causes the DMM system 702 to save the measurement image or current measured parameter in the storage device 122. Option images 704 ("M1"), 705 ("M4"), 706 ("M5"), 708 ("M3"), and 709 ("M2") correspond to module devices 178. As previously discussed, the handheld measurement system 100 may receive measurement parameters from the module devices 178. In FIG. 7B, option images 760, 770 have been selected. As described in FIG. 3 and process 300, the measurement image 755 is modified to include the measured parameters from two module devices 178 (M1 and M5) as shown in FIG. 7B. This allows for real-time measurements from multiple devices to be selected and displayed on touch screen 712. Other module devices could be selected and/or deselected allowing a user to manage six or more module devices while also receiving and displaying measurement parameters from measurement device 102.

While illustrative embodiments have been illustrated and described, it will be appreciated that various changes can be made therein without departing from the spirit and scope of the invention as claimed.

The invention claimed is:

1. A handheld measurement system comprising:
   a measurement device;
   a processor communicatively coupled to the measurement device, wherein the processor is configured to receive primary measurement data from the measurement device, wherein the processor is further configured to generate a measurement image derived from the primary measurement data, and wherein the processor is further configured to generate a plurality of option images, wherein each option image corresponds to a particular option;
   a touch screen system communicatively coupled to the measurement device, wherein the touch screen system is configured to display the measurement image and the option images, wherein the displayed option images are selectable, and wherein the measurement device is configured to modify the measurement image in response to a selection of a displayed option image; and
   a communication system communicatively coupled to the processor, wherein the communication system is further configured to receive secondary measurement data, wherein the secondary measurement data comprises: first module data received from a first module device, second module data received from a second module device, and third module data from a third module device, wherein the module devices are separate from each other,
   wherein a first displayed option image corresponds to a first stored measurement data that includes first module data received from the module device, a second displayed option image corresponds to a second stored measurement data that includes second module data received from the second module device, and a third displayed option image corresponds to a third stored measurement data that includes third module data received from the third module device.

2. The handheld measurement system of claim 1 wherein the measurement image and the plurality of option images are displayed simultaneously.

3. The handheld measurement system of claim 1, wherein the processor is configured to modify the measurement image to exclude or include: the first module data, in response to a selection of the first displayed option image; the second module data, in response to a selection of the second displayed option image; and the third module data, in response to a selection of the third displayed option image.

4. The handheld measurement system of claim 3, wherein the measurement image is modified to include a textual representation of module data included in the measurement image.

5. The handheld measurement system of claim 3, wherein one of the displayed option images other than the first, second, or third option images corresponds to an operation determined by the type of the primary measurement data and the module data included in the measurement image, wherein, in response to a selection of the option image corresponding to the operation, the handheld measurement system is configured to perform the operation and modify the displayed measurement image to include a result of the operation.

6. The handheld measurement system of claim 1, wherein the plurality of option images is generated in response to a user input to the touch screen.

7. The handheld measurement system of claim 1, wherein the processor is further configured to modify the measurement image to exclude or include: the first stored measurement data, in response to a selection of the first displayed option image, the second stored measurement data, in response to a selection of the second option image, and the third stored measurement data, in response to a selection of the third option image.

8. The handheld measurement system of claim 1, wherein the plurality of option images displayed on the touch screen is first plurality of option images, wherein the processor is further configured to generate and display on the touch screen system a second plurality of option images, wherein the second plurality of option images is different than the first plurality of displayed option images and is generated in response to a user input to the touch screen.

9. The handheld measurement system of claim 1, wherein the measurement image includes a textual representation of the primary measurement data.

10. The handheld measurement system of claim 1, wherein the handheld measurement system includes a digital multimeter device.

11. The handheld measurement system of claim 1, wherein one of the displayed option images other than the first, second, or third option images corresponds to an operation determined by a data type of the primary measurement data and a data type of the first stored measurement data, the second stored measurement data, and/or the third stored measurement data, wherein, in response to a selection of the option image corresponding to the operation, the handheld measurement system is configured to perform the operation and modify the displayed measurement image to include a result of the operation.

12. The handheld measurement system of claim 1, wherein the communication system receives the first module data, the second module data, and the third module data over a wireless communication path.

13. A handheld digital multimeter comprising one or more components configured to:
   measure at least one electrical parameter;
   generate a measurement image derived from the at least one measured electrical parameter;
   generate a plurality of option images, wherein each option image corresponds to a particular option;
   simultaneously display the measurement image and the option images on a touch screen, wherein the displayed option images are selectable by an input into the touch screen; and
   modify the measurement image in response to a selection of at least one of the displayed option images,
   wherein the one or more components are further configured to receive secondary electrical measurement parameters from one or more module devices, wherein the secondary measurement data comprises: a first measured module parameter from a first module device, a second measured module parameter from a second module device, and a third measured module parameter from the third module device, wherein the first, second, and third module devices are separate from each other,
   wherein a first displayed option image corresponds to the first module device, a second displayed option image corresponds to the second module device, and a third displayed option image corresponds to the third module device, and
   wherein the one or more components are configured to modify the measurement image to include or exclude: the first measured module parameter, in response to a selection of the first displayed option image; the second measured module parameter, in response to a selection of the second displayed option image; and the third measured module parameter, in response to a selection of the third displayed option image.

14. The handheld digital multimeter of claim 13, wherein one of the displayed option images corresponds to an operation determined by the at least one measured electrical parameter and any module data included in the measurement image, and wherein, in response to a selection of the option image corresponding to the operation, the one or more components are configured to perform the operation and modify the measurement image to include a result of the operation.

15. The handheld digital multimeter of claim 13, wherein more than one option image displayed on the touch screen is simultaneously selectable, and wherein, in response to selection of more than one option image, the measurement image displayed on the touch screen is modified to include or exclude module parameters corresponding to all selected option images.

16. The handheld digital multimeter of claim 13, wherein the one or more components receive the secondary electrical measurement parameters from the one or more module devices over a wireless communication path.

17. A method for displaying a measurement image on a handheld device comprising:
   measuring at least one parameter with a handheld measurement device;
   generating a measurement image that is derived from the measured parameter;
   receiving one or more secondary measurement parameters from module devices that are separate from each other and located remotely from the handheld measurement device;
   generating a plurality of option images;
   simultaneously displaying the generated measurement image and the generated option images on a touch screen, wherein each displayed option image corresponds to a selectable option, and the plurality of option images includes an option image corresponding to each of the module devices;
   receiving a selection at an option image displayed on the touch screen corresponding to a particular module device, and
   modifying the measurement image displayed on the touch screen to include or exclude the secondary measurement parameter of the particular module device corresponding to the selected option image,
   wherein more than one option image displayed on the touch screen is simultaneously selectable, and
   wherein, in response to selection of more than one option image, the measurement image displayed on the touch screen is modified to include or exclude data corresponding to the more than one selected option images.

18. The method of claim 17, further comprising:
   generating and displaying on the touch screen an option image corresponding to each of a plurality of stored electrical measurement parameters;
   receiving a selection at one or more option images displayed on the touch screen; and
   modifying the measurement image displayed on the touch screen to include or exclude the stored measurement parameter corresponding to the selected option image displayed on the touch screen.

19. The method of claim 17, further comprising:
   determining a potential operation based on the type of parameter measured by the handheld measurement device and the type of the received secondary measurement parameters;
   generating and displaying on the touch screen an option image corresponding to the potential operation;
   performing the operation in response to receiving a selection on the touch screen of the option image corresponding to the potential operation; and
   modifying the measurement image displayed on the touch screen to include a result of the operation.

20. The method of claim 17, wherein the plurality of option images displayed on the touch screen is first plurality of option images, the method further comprising:

receiving a selection on the touch screen corresponding to a particular option image in the first plurality of option images;

generating a second plurality of option images that is different than the first plurality of option images; and displaying on the touch screen the second plurality of option images, wherein each displayed option image corresponds to a selectable option.

21. The method of claim 17, wherein a first displayed option image corresponds to a first stored measurement data, a second displayed option image corresponds to a second stored measurement data, and a third displayed option image corresponds to a third stored measurement data, the method further comprising:

in response to a selection of the first displayed option image, retrieving and displaying the first stored measurement data in the measurement image;

in response to a selection of the second displayed option image, retrieving and displaying the second stored measurement data in the measurement image; and in response to a selection of the third displayed option image, retrieving and displaying the third stored measurement data in the measurement image.

22. The method of claim 17, wherein the one or more secondary measurement parameters are received from the module devices over a wireless communication path.

* * * * *